(12) United States Patent
Tsuzumitani et al.

(10) Patent No.: US 6,645,807 B2
(45) Date of Patent: Nov. 11, 2003

(54) METHOD FOR MANUFACTURING SEMICONDUCTOR DEVICE

(75) Inventors: Akihiko Tsuzumitani, Osaka (JP); Yasutoshi Okuno, Kyoto (JP); Toshihiko Nagai, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/234,119

(22) Filed: Sep. 5, 2002

(65) Prior Publication Data

US 2003/0045053 A1 Mar. 6, 2003

(30) Foreign Application Priority Data

Sep. 6, 2001 (JP) ........................................ 2001-270595

(51) Int. Cl.[7] ........................................... H01L 21/8242
(52) U.S. Cl. ........................................ 438/243; 438/250
(58) Field of Search ................................ 438/239, 240, 438/243, 244, 250, 396

(56) References Cited

U.S. PATENT DOCUMENTS 6,459,111 B1 * 10/2002 Natori et al.
6,483,691 B1 * 11/2002 Nakamura

FOREIGN PATENT DOCUMENTS

JP           10-056114 A          2/1998

* cited by examiner

Primary Examiner—Phuc T. Dang
(74) Attorney, Agent, or Firm—McDermott, Will & Emery

(57) ABSTRACT

After a metal layer is formed on a dielectric film, the metal layer is subjected to an oxidation process using a liquid having oxidizing power, thereby forming an adhesion layer. Then, an electrode or wiring is formed on the adhesion layer.

8 Claims, 4 Drawing Sheets thickness α (nm) of lower electrode
(includes thickness of adhesion layer)

METHOD FOR MANUFACTURING SEMICONDUCTOR DEVICE

BACKGROUND OF THE INVENTION

The present invention relates to a method for manufacturing a semiconductor device provided with electrodes or wiring that are formed sandwiching an adhesion layer on a dielectric film.

In semiconductor memories, the reduction in size of memory cells due to the miniaturization of the design is progressing. For example, DRAM (Dynamic Random Access Memory) memory cells, which are one type of semiconductor memories, are made of a memory cell transistor and a capacitor for charging electron. In DRAMs, even though the memory cells have been reduced in size and the area of the capacitor projected onto the substrate (referred to as "capacitor area" in the following) has become small, it is not possible to reduce the capacitance of the capacitor, in order to reduce the power consumption and in order to prevent soft errors. The capacitance of the capacitor is generally proportional to the relative dielectric constant of the dielectric material used for the dielectric film (capacitance dielectric film) constituting the capacitor as well as to the capacitor area, and inversely proportional to the film thickness of the capacitance dielectric film. However, if the film thickness of the capacitance dielectric film is made small in order to increase the capacitance of the capacitor, then the leak current in the capacitor increases. As a result, it becomes necessary to shorten the refresh cycle of the memory cells, so that the power consumption increases. This means that there is a limit to how thin the capacitance dielectric film can be made.

In order to address this problem, in recent years, the use of dielectric materials with high relative dielectric constant (high-k material) for the capacitance dielectric film has been researched as a way of increasing the capacitance of the capacitor. High-k materials that have been researched in detail include for example metal oxides such as aluminum oxide or tantalum pentoxide (composition formula: $Ta_2O_5$), barium strontium titanium oxide (composition formula: $(Ba_{(1-x)}Sr_x)TiO_3$; referred to as "BST" in the following), lead zirconium titanium oxide (referred to as "PZT" in the following), and strontium bismuth tantalum oxide (referred to as "SBT" in the following), which have a perovskite crystal structure.

When the dielectric film is formed using such a high-k material, then, in general, chemical reactions are utilized often, and the formation of the dielectric film is performed in an oxidizing atmosphere, so that if silicon, which has been used conventionally, is used as the electrode material, the silicon tends to be oxidize. That is to say, a silicon oxide film with a low relative dielectric constant is formed, so that it becomes difficult to increase the capacitance of the capacitor. Consequently, a precious metal or a refractory metal or the like is used for the electrodes of capacitors using such a high-k material for the capacitance dielectric film. Furthermore, a precious metal or a refractory metal or the like is used also for the electrodes of capacitors using a ferroelectric material instead of a high-k material for the capacitance dielectric film.

More specifically, when the high-k material tantalum pentoxide is used for the capacitance dielectric film, then ruthenium (symbol of element: Ru), tungsten (symbol of element: W), molybdenum (symbol of element: Mo) or the like is used for the electrodes. Furthermore, when BST is used for the capacitance dielectric film, then Ru, ruthenium dioxide (composition formula: $RuO_2$), platinum (symbol of element: Pt), iridium (symbol of element: Ir) or the like is used for the electrodes. Moreover, when a ferroelectric material such as SBT or PZT is used for the capacitance dielectric film, then Pt, Ir, iridium dioxide (composition formula: $IrO_2$) or the like is used for the electrodes.

FIG. 3 shows the cross-sectional structure of a conventional capacitor using BST for the capacitance dielectric film.

As shown in FIG. 3, an interlayer dielectric film 52 is formed on a semiconductor substrate 51, on which a memory cell transistor (not shown in the figure) is formed. In the interlayer dielectric film 52, a plug 53 for connection with this memory cell transistor is formed. On the interlayer dielectric film 52 including the top of the plug 53, an adhesion layer 54 is formed, and a lower electrode 55 is formed on that adhesion layer 54. The adhesion layer 54 is made of titanium (symbol of element: Ti) or tantalum (symbol of element: Ta) or of an oxide or a nitride of these metals. On the lower electrode 55, a capacitance dielectric film 56 is formed so as to cover the top surface and the lateral surfaces of the lower electrode 55. On the capacitance dielectric film 56, an upper electrode 57 is formed. The three-layered structure of the lower electrode 55, the capacitance dielectric film 56 and the upper electrode 57 constitutes the capacitor. The lower electrode 55 and the upper electrode 57 are made of Pt. The capacitance dielectric film 56 is made of a BST film with a thickness of about 25 nm.

Here, the adhesion of the lower electrode 55 to the dielectric film is weak, so that if the lower electrode 55 is formed directly on the interlayer dielectric film 52, then there is the possibility that the lower electrode 55 separates from the interlayer dielectric film 52. To prevent this, the adhesion layer 54 made of a metal such as Ti or Ta or an oxide (e.g. $TiO_x$, $TaO_x$) or a nitride (e.g. $TiN_x$, $TaN_x$) of these metals is arranged between the lower electrode 55 and the interlayer dielectric film 52, thus improving the adhesion of the lower electrode 55 to the underlying dielectric film. It should be noted that recently, oxides and nitrides of, for example, titanium aluminum, tantalum silicon or tantalum aluminum have been used as the material for the adhesion layer 54.

However, such an adhesion layer oxidizes much easier than the electrodes made of a refractory metal or precious metal. Furthermore, depending on the thickness and the formation method of the adhesion layer, the metal atoms constituting the adhesion layer (referred to as "adhesion layer metal" in the following) may be diffused throughout the lower electrode and be deposited on the surface of the lower electrode. When in this situation a high-k film such as a BST film is formed as the capacitance dielectric film, then it is ordinarily formed in an oxidizing atmosphere of about 300 to 700° C., so that the adhesion layer metal that has been deposited on the surface of the lower electrode is oxidized. As a result, a volume expansion occurs due to the oxidized layer formed on the surface of the lower electrode, so that an excess force is exerted on the capacitor portion or film separation occurs.

On the other hand, a method of suppressing the diffusion of the adhesion layer metal throughout the electrode and the deposition on the electrode surface is conceivable in which a sufficiently oxidized adhesion layer is formed first. However, the following problems occur if in the course of forming, for example, a titanium oxide ($TiO_x$) film as the adhesion layer a Ti film is annealed in an oxidizing atmosphere to form the $TiO_x$ film, or the $TiO_x$ film is deposited while letting Ti react with oxygen in a vapor phase, or the $TiO_x$ film is deposited using a reactive sputtering process, by admixing oxygen when sputtering Ti.

In the case of annealing a Ti film in an oxidizing atmosphere, a temperature of at least 500° C. is necessary, so that impurities included in the source and drain regions of the transistor already formed on the substrate are diffused again, so that the desired transistor properties cannot be obtained.

In the case of depositing the $TiO_x$ film while letting Ti react with oxygen, or in the case of depositing the $TiO_x$ film using a reactive sputtering process, the Ti may not be sufficiently oxidized, so that as mentioned above, Ti atoms are diffused throughout the Pt film (i.e. the Pt electrode) serving as the lower electrode, and deposited on the Pt electrode surface. Therefore, when a BST film, a $Ta_2O_5$ film or a PZT film with high relative dielectric constant are formed as the capacitance dielectric film on the Pt electrode, the Ti atoms deposited on the Pt electrode surface are oxidized, thereby forming a Ti oxide film with low relative dielectric constant on the Pt electrode surface. As a result, the formation of this Ti oxide film causes an excessive force to be exerted between the lower electrode and the capacitance dielectric film, and film separation occurs. Furthermore, because the relative dielectric constant of the Ti oxide film is low, it is in the end not possible to attain a capacitor with a large capacitance.

Furthermore, if the Ti atoms are deposited on the Pt electrode surface, the compositional balance between, for example, Ba, Sr and Ti in a BST film formed as the capacitance dielectric film on the Pt electrode is destroyed due to the influence of the Ti atoms deposited on the Pt electrode surface, so that the desired properties of the BST film cannot be attained. Furthermore, if Ti atoms are deposited on the Pt electrode surface, and if a ferroelectric material having a perovskite structure, such as PZT or SBT, is used for the capacitance dielectric film, then, as a result of the Ti atoms entering the perovskite structure, it may not be possible to attain the desired film properties required by a capacitance dielectric film using a ferroelectric material as described above.

In the stacked capacitor structure of the conventional example shown in FIG. 3, there are no particular problems if the film thickness of the adhesion layer is thick at 10 nm or more. On the other hand, the cup-type capacitor structure shown in FIG. 4A requires to making the lower electrode as well as the adhesion layer thinner.

FIG. 4A is a cross-sectional drawing of conventional cup-type capacitors, and

FIG. 4B is a graph showing the aspect ratio of the cups (recesses) in which the upper electrode is formed as a function of the thickness of the lower electrode (including the thickness of the adhesion layer).

As shown in FIG. 4A, an insulating layer 60 is provided with a recess 60a for capacitor formation, and a plug 61 is buried below the recess 60a in the dielectric film 60. A lower electrode 62 is formed on the bottom of the recess 60a, including the top surface of the plug 61, and the walls of the recess 60a, sandwiching an adhesion layer (not shown in the figure), thus yielding a recess 60b. Furthermore, a capacitance dielectric film 63 is formed on the dielectric film 60 including the recess 60b, yielding a recess 60c. On the capacitance dielectric film 63, an upper electrode 64 is formed, yielding a recess 60d. That is to say, the cup-type capacitor is constituted by a three-layered structure of the lower electrode 62, the capacitance dielectric film 63 and the upper electrode 64. Here, the lower electrode 62 and the upper electrode 64 are made of Pt films. Furthermore, the capacitance dielectric film 63 is made of a BST film of 25 nm thickness.

It should be noted that in FIG. 4A, the adhesion layer is drawn unitarily with the lower electrode 62. Furthermore, in FIG. 4A, $\alpha$ indicates the thickness of the lower electrode 62 including the thickness of the adhesion layer, $\beta$ indicates the separation width between memory cells, and 2F indicates the array pitch between the cup-type capacitors.

As shown in FIG. 4B, as the thickness $\alpha$ of the lower electrode (including the adhesion layer) becomes large, the aspect ratio of the recesses (cups) 60c in which the upper electrode 64 is formed becomes extremely large, so that the formation of the upper electrode 64 becomes impossible in practice. As further shown in FIG. 4B, as the array pitch 2F (in FIG. 4B, 2F is indicated by its half value F) of the cup-type capacitor becomes small, the aspect ratio for the same value of $\alpha$ becomes large.

Consequently, in cup-type capacitors, if the thickness of the adhesion layer is not reduced together with the thickness of the lower electrode in order to miniaturize the memory cell, then it is difficult to bury the upper electrode inside the cup.

It should be noted that the results shown in FIG. 4B have been obtained by keeping the separation width $\beta$ constant at 50 nm, and varying the half value F of the array pitch 2F over 0.10 $\mu$m, 0.13 $\mu$m and 0.15 $\mu$m. Here, the half value F corresponds to a design rule for the transistor, and in current DRAMs, this design rule F for the transistor is such that memory cells are designed to have an area of $2F \times 4F = 8F^2$. That is to say, the pitch of the capacitors is 2F on the shorter side and 4F on the longer side. Consequently, 4A shows the cross-sectional structure along the shorter side of a cup-type capacitor.

SUMMARY OF THE INVENTION

It is an object of the present invention to present a method for manufacturing a semiconductor device in which a sufficient adhesion can be maintained between a dielectric film and an electrode or wiring, in which a decrease of the dielectric constant when forming a capacitance element can be prevented, and in which the formation of an electrode can be performed easily when forming a capacitance element such as a cup-type capacitor having an electrode that is buried in a recess.

In order to achieve these objects, a first method for manufacturing a semiconductor device includes the steps of forming a metal layer on a dielectric film, forming an adhesion layer by subjecting the metal layer to an oxidation process using a liquid having oxidizing power, and forming an electrode or wiring on the adhesion layer.

With this first method for manufacturing a semiconductor device, first a metal layer is formed on a dielectric film, and then the metal layer is subjected to an oxidation process using a liquid acting as an oxidizing agent, so that the metal layer can be sufficiently oxidized, and an electrode or wiring can be formed on the thusly formed adhesion layer. Thus, the metal atoms in the adhesion layer do not diffuse throughout the electrode or wiring and are not deposited on the surface of the electrode or wiring, so that no oxide film will be formed on the surface of the electrode or wiring in the steps after the electrode or wiring has been formed. As a result, film separation caused by volume expansion of the oxide can be prevented, so that it is possible to form an adhesion layer with favorable adhesion. Consequently, a semiconductor device can be manufactured, in which a sufficient adhesion between the electrode or wiring and the dielectric film can be maintained.

Furthermore, when a capacitance element has been formed with this first method for manufacturing a semiconductor device, the metal atoms in the adhesion layer below the lower electrode are not deposited on the surface of the lower electrode, so that an oxide film with low relative dielectric constant is not formed on the surface of the lower electrode when forming a capacitance dielectric film made of a material with high dielectric constant on the lower electrode. Consequently, a decrease in the dielectric constant of the capacitance element, that is, a decrease of the capacitance can be prevented.

In the first method for manufacturing a semiconductor device, it is preferable that the metal layer is made of titanium.

In that case, an adhesion layer with favorable adhesion made of titanium oxide can be reliably formed by sufficiently oxidizing the titanium metal layer.

In the first method for manufacturing a semiconductor device, it is preferable that the thickness of the metal layer is at least 1 nm and at most 10 nm.

In that case, in addition to the previously described effects, a sufficient adhesion can be maintained while forming the adhesion layer by sufficiently oxidizing the metal layer, because the thickness of the metal layer has been set to at least 1 nm and at most 10 nm. Furthermore, since the thickness of the metal layer that is turned into the adhesion layer is at least 1 nm and at most 10 nm thin, if the first method for manufacturing a semiconductor device is applied to the formation of cup-type capacitors, an increase in the aspect ratio of the cups (recesses) in which the upper electrodes are buried can be prevented. Consequently, the upper electrodes can be formed easily.

In the first method for manufacturing a semiconductor device, it is preferable that the liquid having oxidizing power is water, hydrogen peroxide water or ozone water.

In that case, an adhesion layer with favorable adhesion can be reliably formed by sufficiently oxidizing the metal layer.

A second method for manufacturing a semiconductor device includes the steps of forming a metal layer on a dielectric film, forming an adhesion layer by subjecting the metal layer to an oxidation process using a liquid having oxidizing power, forming a first electrode on the adhesion layer, forming a capacitance dielectric film on the first electrode, and forming a second electrode on the capacitance dielectric film.

With this second method for manufacturing a semiconductor device, first a metal layer is formed on a dielectric film, and then the metal layer is subjected to an oxidation process using a liquid acting as an oxidizing agent, so that the metal layer can be sufficiently oxidized, and a first electrode (lower electrode of the capacitance element) can be formed on the thusly formed adhesion layer. Thus, the metal atoms in the adhesion layer do not diffuse throughout the lower electrode and are not deposited on the surface of the lower electrode, so that no oxide film will be formed on the surface of the lower electrode when forming a capacitance dielectric film made of a material with high relative dielectric constant on the lower electrode. As a result, film separation caused by volume expansion of the oxide can be prevented, so that it is possible to form an adhesion layer with favorable adhesion. Furthermore, since no oxide film with low relative dielectric constant is formed on the lower electrode surface, a decrease in the dielectric constant of the capacitance element, that is, a decrease in the capacitance can be prevented. Consequently, a semiconductor device can be manufactured that has a capacitance element, in which a sufficient adhesion between the lower electrode and the underlying dielectric film can be maintained, and in which a sufficient capacitance can be ensured.

In the second method for manufacturing a semiconductor device, it is preferable that the metal layer is made of titanium.

In that case, an adhesion layer with favorable adhesion made of titanium oxide can be reliably formed by sufficiently oxidizing the titanium metal layer.

In the second method for manufacturing a semiconductor device, it is preferable that the thickness of the metal layer is at least 1 nm and at most 10 nm.

In that case, in addition to the previously described effects, a sufficient adhesion can be maintained while forming the adhesion layer by sufficiently oxidizing the metal layer, because the thickness of the metal layer has been set to at least 1 nm and at most 10 nm. Furthermore, since the thickness of the metal layer that is turned into the adhesion layer is at least 1 nm and at most 10 nm thin, if the second method for manufacturing a semiconductor device is applied to the formation of cup-type capacitors, an increase in the aspect ratio of the cups (recesses) in which the upper electrodes are buried can be prevented. Consequently, the upper electrodes can be formed easily to the bottom of the cups, and the yield of the capacitors can be improved.

In the second method for manufacturing a semiconductor device, it is preferable that the liquid having oxidizing power is water, hydrogen peroxide water or ozone water.

In that case, an adhesion layer with favorable adhesion can be reliably formed by sufficiently oxidizing the metal layer.

DETAILED DESCRIPTION OF THE INVENTION

Referring to the accompanying drawings, the following is an explanation of a method for manufacturing a semiconductor device in accordance with an embodiment of the present invention, taking the formation of a capacitance element having a cup-type capacitor structure as an example.

FIGS. 1A to 1E and FIGS. 2A to 2C are cross-sectional drawings illustrating the steps of a method for manufacturing a semiconductor device in accordance with an embodiment of the present invention.

Figure 1A:
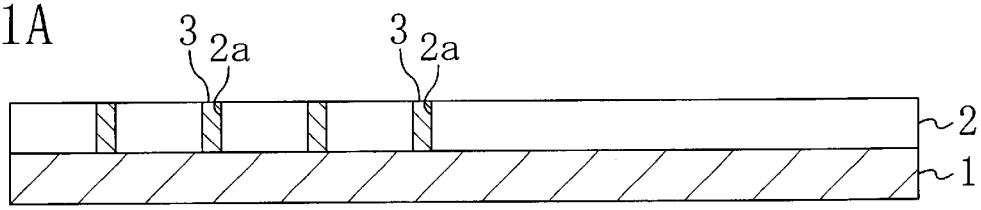
FIGS. 1A to 1E are cross-sectional drawings illustrating steps of a method for manufacturing a semiconductor device in accordance with an embodiment of the present invention.

First, as shown in FIG. 1A, the gate electrodes and the source drain regions (not shown in the figure) of memory cell transistors constituting, for example, DRAM cells are formed on a silicon substrate 1 made of a wafer with an 8 inch diameter. A first interlayer dielectric film 2 made of a silicon oxide film is formed, for example by CVD (Chemical Vapor Deposition), on the silicon substrate 1. Subsequently, using lithography and dry-etching techniques, connection holes 2a are formed through the first interlayer dielectric film 2 down to a predetermined portion (the source region of the memory cell transistors in the case of DRAM cells) of the silicon substrate 1. Then, the connection holes 2a are filled with polysilicon film, thus forming polysilicon plugs 3.

Figure 1B:
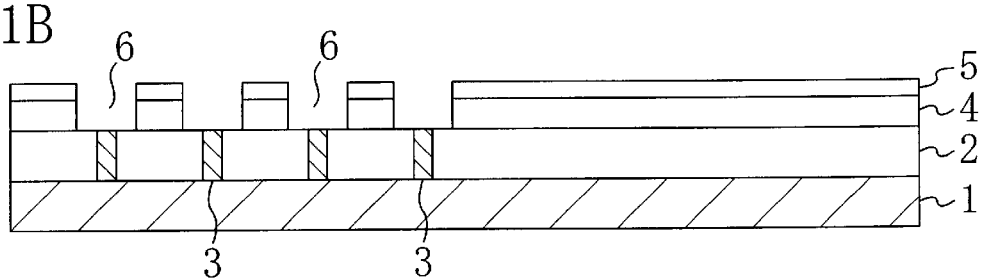

Next, as shown in FIG. 1B, a second interlayer dielectric film 4 made of a silicon oxide film, and a third interlayer dielectric film 5 made of a silicon nitride film are formed in that order on the silicon substrate 1, for example by CVD. Subsequently, using lithography and dry-etching techniques, recesses 6 are formed into the second interlayer dielectric film 4 and the third interlayer dielectric film 5 down to the top of the polysilicon plugs 3. Here, the diameter of the recesses 6 is for example 0.40 μm, and the diameter of the connection holes 2a formed in the first interlayer dielectric film 2 is for example 0.15 μm.

Figure 1C:
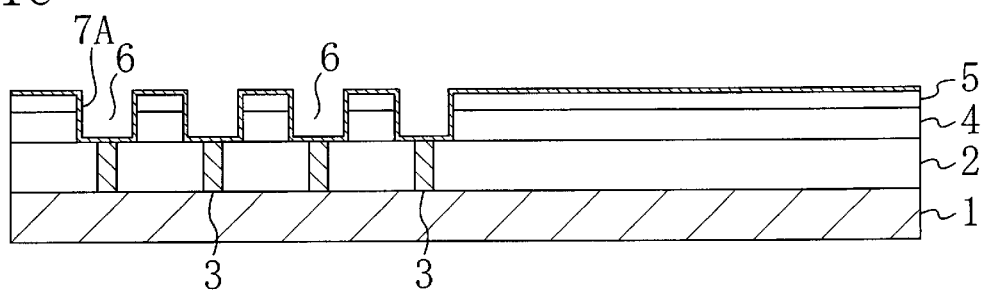
Figure 1D:
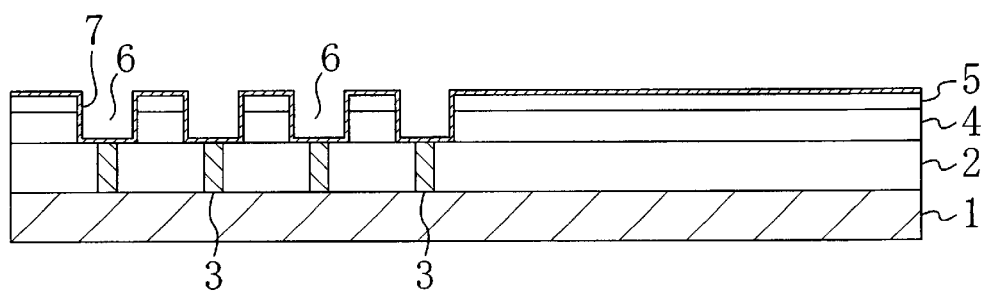

Next, as shown in FIG. 1C, a metal layer 7A of about 1 to 10 nm thickness (for example 3 nm) made of, for example, Ti is formed on the third interlayer dielectric film 5 including the bottom and the walls of the recesses 6. After that, the metal layer 7A is rinsed with water for about 5 min. For this, a temperature of 25 to 50° C. is suitable for the rinsing water. Thus, as shown in FIG. 1D, the metal layer 7A is oxidized, and an adhesion layer 7 made of titanium oxide ($TiO_x$) can be formed. In this situation, if the thickness of the metal layer 7A is at least 1 nm and not more than 10 nm, then the metal layer 7A can be sufficiently oxidized by rinsing with water, and the thusly formed sufficiently oxidized $TiO_x$ film can serve as an adhesion layer 7 with superior adhesion. If, on the other hand, the thickness of the metal layer 7A is less than 1 nm, then a sufficient adhesion may not be attained by the adhesion layer 7. Furthermore, if the thickness of the metal layer 7A is larger than 10 nm, then the metal layer 7A is not sufficiently oxidized by the rinsing with water, so that metal atoms (Ti atoms) may be diffused throughout the Pt electrode formed on the adhesion layer 7.

It should be noted that besides pure water, it is also possible to use hydrogen peroxide ($H_2O_2$) water or ozone ($O_3$) water or the like as the liquid for oxidizing the metal layer 7A.

Figure 1E:
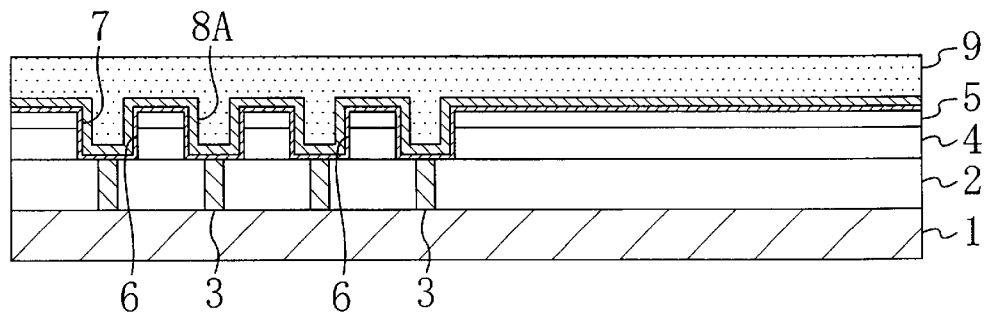

Next, as shown in FIG. 1E, a Pt film 8A of about 20 nm thickness serving as the lower electrode is formed on the adhesion layer 7, for example by sputtering, until the recesses 6 are mid-way filled up. Here, by forming the Pt film 8A on the third interlayer dielectric film 5 including the recesses 6 with the adhesion layer 7 made of $TiO_x$ interposed between the interlayer dielectric film and the Pt film 8A, film separation can be prevented better than in the case of directly forming the Pt film 8A on the third interlayer dielectric film 5 including the recesses 6. Next, using for example CVD, a silicon oxide film 9 of about 400 nm thickness is formed on the Pt film 8A, completely filling up the recesses 6.

Figure 2A:
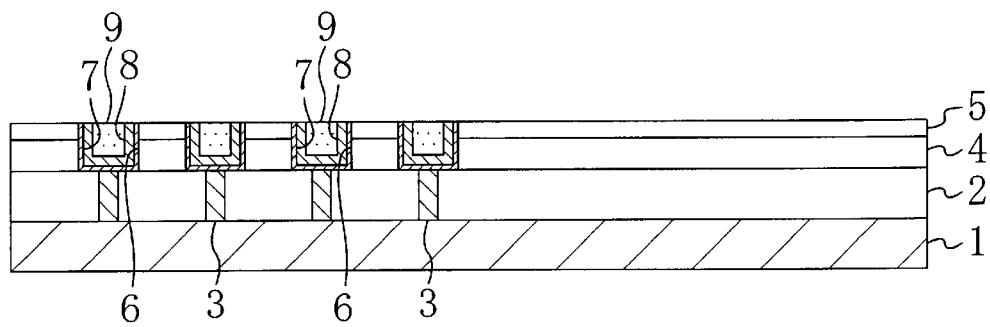
FIGS. 2A to 2C are cross-sectional drawings illustrating steps of a method for manufacturing a semiconductor device in accordance with an embodiment of the present invention.

Next, as shown in FIG. 2A, the silicon oxide film 9 is etched back by dry etching for example, removing it down to a depth of 400 nm from its surface, and leaving the silicon oxide film 9 only in the recesses 6. Subsequently, with the remaining silicon oxide film 9 as a mask, the portions of the Pt film 8A outside of the recesses 6 are selectively removed by dry etching with, for example, Ar gas, $O_2$ gas and $Cl_2$ gas, and also the portions of the adhesion layer 7 outside of the recesses 6 are selectively removed. Thus, the lower electrodes 8 made of a Pt film are formed on the walls and the bottom of the recesses 6, sandwiching the adhesion layer 7.

Figure 2B:
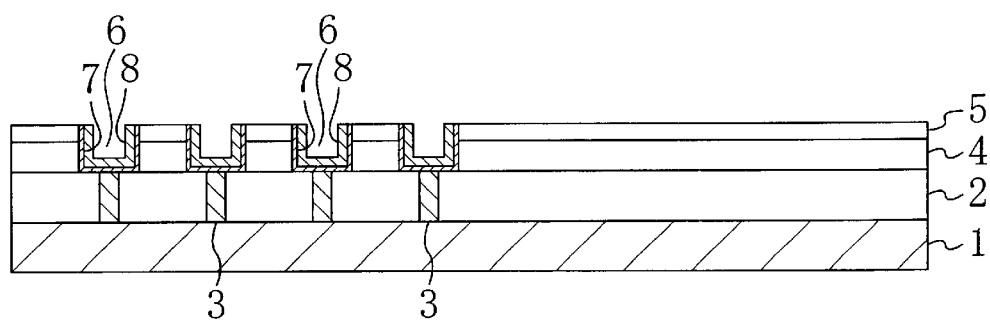

Then, as shown in FIG. 2B, the silicon oxide film 9 remaining inside the recesses 6 is removed by for example a HF (hydrogen fluoride) solution.

Figure 2C:
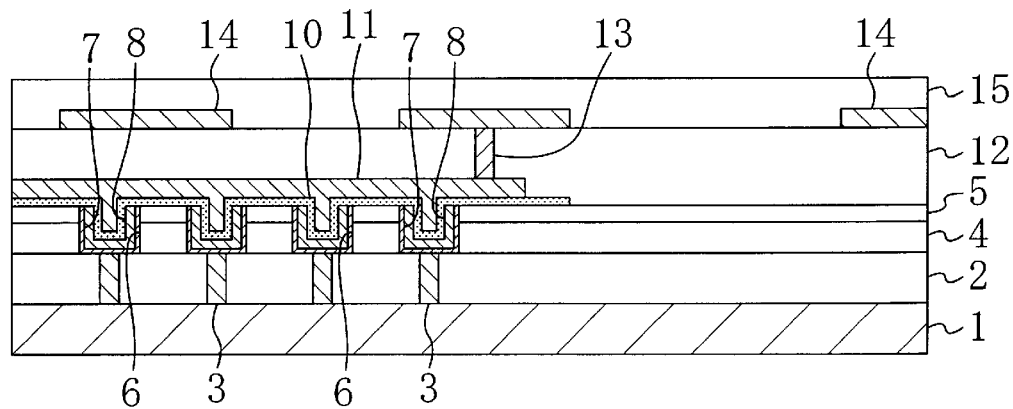
Figure 3:
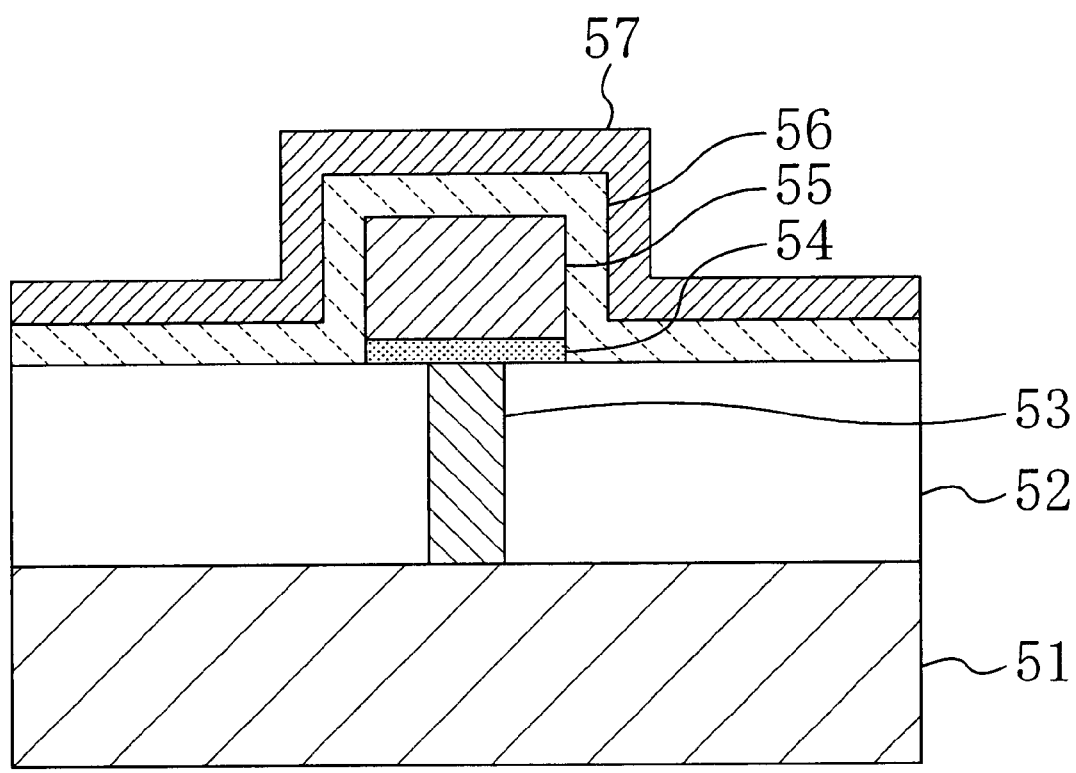
FIG. 3 illustrates the cross-sectional structure of a conventional capacitor.
Figure 4A:
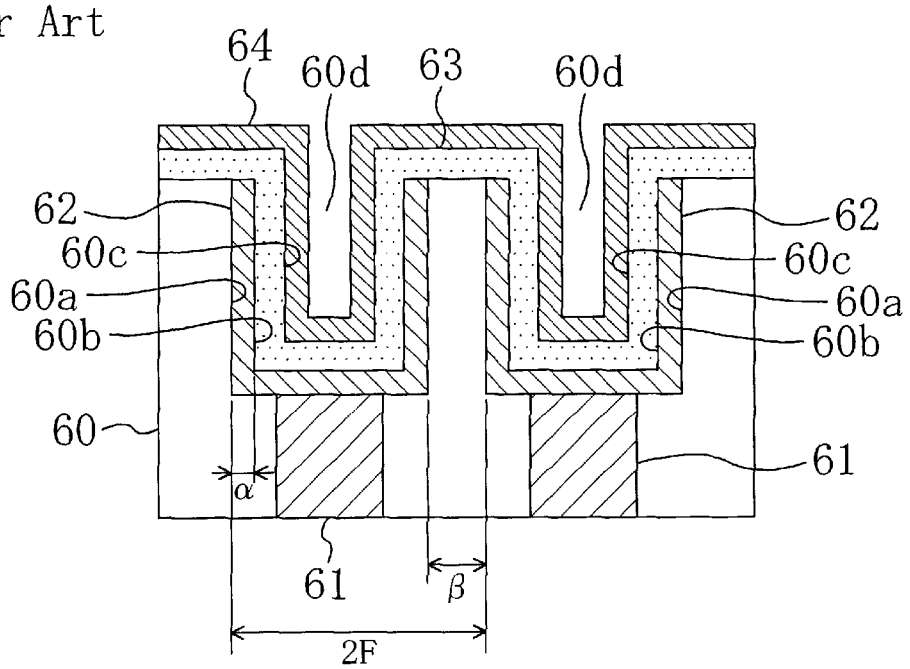
FIG. 4A is a cross-sectional diagram of conventional cup-type capacitors.
Figure 4B:
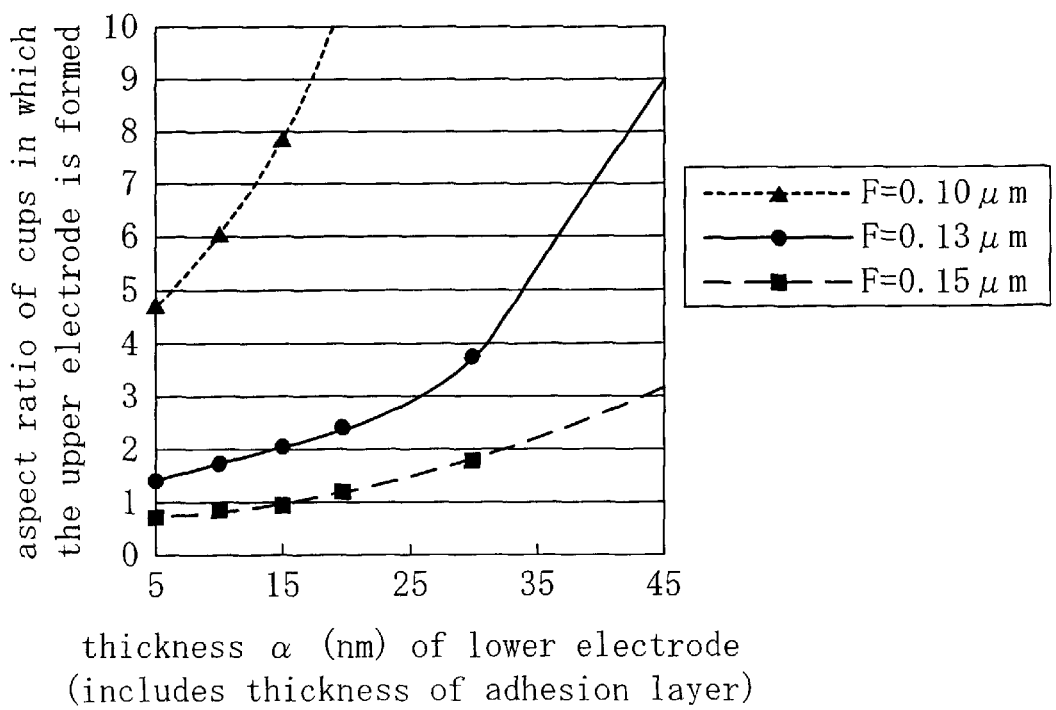
FIG. 4B is a graph showing the aspect ratio of the cups (recesses) in which the upper electrode is formed as a function of the thickness of the lower electrode (including the thickness of the adhesion layer), in the capacitors shown in FIG. 4A.

Next, as shown in FIG. 2C, by forming with the usual processes, in that order, a capacitance dielectric film 10 serving as the dielectric and an upper electrode 11 in the recesses 6 in which the lower electrodes 8 are formed, a cup-type capacitor is achieved, that has a three-layer structure of lower electrode 8, capacitance dielectric film 10 and upper electrode 11. More specifically, after a capacitance dielectric film 10 made of a high-k material with a thickness of about 20 nm has been formed, for example by CVD, on the lower electrode 8 in the recesses 6 and on a predetermined portion of the third interlayer dielectric film 5, an upper electrode 11 made of Pt with a thickness of about 100 nm is formed on the capacitance dielectric film 10, for example by RF sputtering.

It should be noted that for the capacitance dielectric film 10, it is possible to use a metal oxide such as aluminum oxide or tantalum pentoxide, or a material having a perovskite crystal structure, such as BST, PZT or SBT as a material with a high relative dielectric constant.

Next, as shown in FIG. 2C, after a fourth interlayer dielectric film 12 made of a silicon oxide film has been formed on the third interlayer dielectric film 5 including the top of the upper electrode 11, a contact plug 13 for connecting the upper electrode 11 is formed through the fourth interlayer dielectric film 12. Subsequently, an upper layer wiring 14 for connecting the contact plug 13 is formed on the fourth interlay dielectric film 12, and then a protective dielectric film 15 covering the upper layer wiring 14 is formed. Thus, a semiconductor device having cup-type capacitors is obtained.

As explained in the foregoing, with this embodiment, the metal layer 7A is subjected to an oxidation process by rinsing with water after it has been formed on the third interlayer dielectric film 5 in which the recesses 6 for formation of the capacitance elements have been formed. Thus, the metal layer 7A can be sufficiently oxidized, and the lower electrode 8 (Pt electrode) of the capacitance elements can be formed on the thusly formed adhesion layer 7. Therefore, the metal atoms (Ti atoms) in the adhesion layer 7 will not diffuse throughout the Pt electrode and be deposited on the Pt electrode surface, so that an oxide film of Ti is not formed on the Pt electrode surface when forming on the Pt electrode a capacitance dielectric film 10 made of a material with a high relative dielectric constant. As a result, film separation caused by volume expansion of the oxide can be prevented, so that a sufficient adhesion strength can be attained by the adhesion layer 7. Furthermore, since no Ti oxide film with low relative dielectric constant is formed on the Pt electrode surface, a decrease in the dielectric constant of the capacitor, or in other words, a decrease of the capacitance can be prevented. Consequently, a semiconductor device can be manufactured that has a capacitance element in which sufficient adhesiveness between the lower electrode and the underlying dielectric film can be maintained and a sufficient capacitance can be ensured.

Moreover, in accordance with this embodiment, the thickness of the metal layer 7A serving as the adhesion layer 7 is sufficiently thin at 1 to 10 nm, so that the aspect ratio of the recesses 6 when forming the upper electrode layer 11, that is, the aspect ratio of the recesses 6 that have been filled up mid-way by forming, in order, the adhesion layer 7, the lower electrode 8 and the capacitance dielectric film 10 does not become extremely large. In other words, it is possible to prevent an increase in the aspect ratio of the cups in which the upper electrode 11 is formed. Consequently, the upper electrode 11 can be easily formed to the bottom of the cups (recesses 6), so that the production yield of the capacitor can be increased. That is to say, by making the adhesion layer 7 thinner, the method of this embodiment can be applied easily to the formation of cup-type capacitors.

It should be noted that in this embodiment, the metal layer 7A was oxidized by rinsing with water, but needless to say, the same effect can be attained by oxidizing the metal layer 7A using any other liquid having oxidizing power, such as hydrogen peroxide water or ozone water.

Furthermore, in this embodiment, $TiO_x$ was used as the material of the adhesion layer 7, but there is no particular limitation to the material of the adhesion layer 7, as long as it displays the same effect as $TiO_x$. Furthermore, Ti was used as the material of the metal layer 7A that is turned into the adhesion layer 7, but instead it is also possible to use for example Ta, TiAl, TiW, TaAl, TiSi or TaSi.

In this embodiment, the adhesion layer 7 was formed on the bottom and the walls of the recesses 6, but instead it is also possible to form the adhesion layer 7 only on the bottom of the recesses 6. Also in this case, it is possible to ensure sufficient adhesion (between the first interlayer dielectric film 2 and the lower electrode 8) due to the adhesion layer 7.

Also, this embodiment addressed the formation of the adhesion layer between the lower electrode (lower electrode 8) of a capacitor and the underlying dielectric film (first interlayer dielectric film 2). However, the present invention is not limited to this, and it can also address the formation of an adhesion layer between an electrode and an insulating layer of a GaN-based semiconductor laser, between an address line and an insulating layer of a TFT liquid crystal display device or between a gate electrode line and a dielectric film, for example.

Incidentally, in this embodiment, regarding the limitation of the thickness of the metal layer 7A that is turned into the adhesion layer 7, that is, the thickness of the Ti film to the range of 1 to 10 nm, the inventors have performed the following experiment, and determined the afore-mentioned range for the thickness of the Ti film based on the results of this experiment. The following is an explanation of that experiment. First, for the case that a Ti film is used for the adhesion layer, the inventors performed an experiment regarding the relation between the adhesion of the Pt film to the dielectric film and the thickness of the Ti film. The result was that film separation did not occur in a separation test using a tape having an adhesive power of 8 N/cm if the film thickness of the Ti film was at least about 1 nm.

However, the inventors also found that when the Ti film is thick (for example, when the thickness of the Ti film is at least 3 nm), then Ti atoms diffuse throughout the Pt electrode and are deposited on the Pt electrode surface. When Ti atoms are present at the Pt electrode surface, the Ti atoms are oxidized when forming a BST film, a $Ta_2O_5$ film or a PZT film with high relative dielectric constant on the Pt electrode, so that a Ti oxide film with small relative dielectric constant is formed on the Pt electrode surface, and as a result, the capacitance of the capacitor cannot be made large.

Furthermore, if Ti atoms are present at the Pt electrode surface and a BST film is formed on the Pt electrode, then the compositional balance between Ba, Sr and Ti in the BST film is destroyed due to the influence of the Ti atoms deposited on the Pt electrode surface, so that the desired properties of the BST film cannot be attained. Furthermore, if Ti atoms are present at the Pt electrode surface, and if a dielectric film having a perovskite structure, such as PZT or SBT, is formed on the Pt electrode, then, as a result of the Ti atoms entering the perovskite structure, it may not be possible to attain the desired film properties required by the dielectric film.

Furthermore, for the case that a Ti oxide film is used for the adhesion layer, the inventors performed an experiment regarding the relation between the adhesion of the Pt film to the dielectric film and the thickness of the Ti oxide film. If the method described in the "Background of the Invention" was used to form this Ti oxide film, several difficulties occurred. For example, impurities included in the source and drain regions of transistors already formed on the substrate were diffused again, and film separation occurred due to the fact that the Ti film was not sufficiently oxidized. If, however, after forming the Ti film, the Ti film was oxidized by rinsing with water, thereby forming a Ti oxide film, as explained in this embodiment, then there was no problem at all with the adhesion of the formed Ti oxide film, even when the Ti film was extremely thin at about 1 nm. Furthermore, when the same experiment was performed while varying the thickness of the Ti film between 1 and 20 nm, it was found that when the thickness of the Ti film exceeds 10 nm, the Ti film cannot be sufficiently oxidized. Consequently, the inventors determined that a preferable range for the thickness of the Ti film which is turned into the adhesion layer 7, that is, the metal layer 7A, is 1 to 10 nm.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor device, comprising the steps of:
   forming a metal layer on a dielectric film;
   forming an adhesion layer composed of a metal oxide by subjecting the metal layer to an oxidation process using a liquid having oxidizing power; and
   forming an electrode or a wiring on the adhesion layer, wherein the electrode or the wiring is in contact with the metal oxide composing the adhesion layer.

2. The method for manufacturing a semiconductor device according to claim 1, wherein the metal layer is made of titanium.

3. The method for manufacturing a semiconductor device according to claim 1, wherein the metal layer is at least 1 nm and at most 10 nm thick.

4. The method for manufacturing a semiconductor device according to claim 1, wherein the liquid having oxidizing power is water, hydrogen peroxide water or ozone water.

5. A method for manufacturing a semiconductor device, comprising the steps of:
   forming a metal layer on a dielectric film;
   forming an adhesion layer composed of a metal oxide by subjecting the metal layer to an oxidation process using a liquid having oxidizing power;
   forming a first electrode on the adhesion layer;
   forming a capacitance dielectric film on the first electrode; and
   forming a second electrode on the capacitance dielectric film,
   wherein the first electrode is in contact with the metal oxide composing the adhesion layer.

6. The method for manufacturing a semiconductor device according to claim 5, wherein the metal layer is made of titanium.

7. The method for manufacturing a semiconductor device according to claim 5, wherein the metal layer is at least 1 nm and at most 10 nm thick.

8. The method for manufacturing a semiconductor device according to claim 5, wherein the liquid having oxidizing power is water, hydrogen peroxide water or ozone water.

* * * * *